(12) United States Patent
Yoshikawa et al.

(10) Patent No.: US 10,886,219 B2
(45) Date of Patent: Jan. 5, 2021

(54) ELECTRONIC COMPONENT MOUNTING PACKAGE

(71) Applicant: TDK CORPORATION, Tokyo (JP)

(72) Inventors: Kazuhiro Yoshikawa, Tokyo (JP); Mitsuhiro Tomikawa, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/478,409

(22) PCT Filed: Jan. 10, 2018

(86) PCT No.: PCT/JP2018/000314
§ 371 (c)(1),
(2) Date: Jul. 16, 2019

(87) PCT Pub. No.: WO2018/135349
PCT Pub. Date: Jul. 26, 2018

(65) Prior Publication Data
US 2019/0378791 A1 Dec. 12, 2019

(30) Foreign Application Priority Data
Jan. 18, 2017 (JP) .................................. 2017-006620

(51) Int. Cl.
*H01L 23/528* (2006.01)
*H01L 23/28* (2006.01)
(Continued)

(52) U.S. Cl.
CPC ............ *H01L 23/528* (2013.01); *H01L 23/28* (2013.01); *H01L 23/642* (2013.01); *H01L 28/60* (2013.01)

(58) Field of Classification Search
CPC ..... H01L 21/6835; H01L 23/12; H01L 23/28; H01L 23/528; H01L 23/60; H01L 23/642;
(Continued)

(56) References Cited

U.S. PATENT DOCUMENTS 9,161,433 B2    10/2015  Yoshida et al.
10,424,563 B2 *  9/2019  Lin ......................... H01L 25/16
(Continued)

FOREIGN PATENT DOCUMENTS

CN       106169466 A    11/2016
JP       2001-177008 A   6/2001
(Continued)

OTHER PUBLICATIONS

Mar. 20, 2018 Search Report issued in International Patent Application No. PCT/JP2018/000314.
(Continued)

*Primary Examiner* — Allan R Wilson
(74) *Attorney, Agent, or Firm* — Oliff PLC

(57) ABSTRACT

An electronic component mounting package includes a semiconductor element which is disposed such that an active surface faces a main surface of a wiring portion, and which is electrically connected to the wiring portion via a first terminal; and a thin film passive element which is disposed between the active surface of the semiconductor element and the main surface of the wiring portion when seen in a lamination direction, and which is electrically connected to the semiconductor element. A part of the first terminal is disposed on an outer side with respect to the thin film passive element in a plan view. A length of the first terminal in the lamination direction disposed on the outer side with respect to the thin film passive element is larger than a thickness of the thin film passive element in the lamination direction.

5 Claims, 8 Drawing Sheets

(51) Int. Cl.
  *H01L 23/64*  (2006.01)
  *H01L 49/02*  (2006.01)
(58) Field of Classification Search
  CPC ..... H01L 24/19; H01L 24/20; H01L 25/0655; H01L 25/0657; H01L 25/105; H01L 25/16; H01L 25/50; H05K 9/00
  See application file for complete search history.

(56) References Cited

U.S. PATENT DOCUMENTS

| | | | |
|---|---|---|---|
| 2002/0195270 A1 | 12/2002 | Okubora et al. | |
| 2004/0067605 A1 | 4/2004 | Koizumi | |
| 2004/0169294 A1 | 9/2004 | Kanayama et al. | |
| 2005/0068748 A1 | 3/2005 | Ogawa | |
| 2005/0140434 A1 | 6/2005 | Abe et al. | |
| 2007/0076392 A1* | 4/2007 | Urashima | H01L 24/81 361/763 |
| 2007/0263364 A1* | 11/2007 | Kawabe | H01L 23/49822 361/728 |
| 2008/0251285 A1* | 10/2008 | Sato | H01G 4/33 174/260 |
| 2008/0251913 A1 | 10/2008 | Inomata | |
| 2009/0225525 A1 | 9/2009 | Mano et al. | |
| 2010/0061071 A1 | 3/2010 | Watanabe | |
| 2013/0063902 A1 | 3/2013 | Yoshida et al. | |
| 2013/0249118 A1* | 9/2013 | Do | H01L 23/49816 257/782 |
| 2014/0084416 A1* | 3/2014 | Kang | H01L 25/16 257/532 |
| 2016/0056100 A1* | 2/2016 | Yeh | H01L 23/5389 257/676 |
| 2016/0262260 A1 | 9/2016 | Oyamada et al. | |
| 2016/0343694 A1 | 11/2016 | Lin et al. | |

FOREIGN PATENT DOCUMENTS

| | | |
|---|---|---|
| JP | 2002-009445 A | 1/2002 |
| JP | 2003-069185 A | 3/2003 |
| JP | 2004-128219 A | 4/2004 |
| JP | 2008-071953 A | 3/2008 |
| JP | 2012-138595 A | 7/2012 |
| JP | 2013-030528 A | 2/2013 |
| JP | 2013-058646 A | 3/2013 |
| JP | 2015-082516 A | 4/2015 |

OTHER PUBLICATIONS

Jul. 23, 2019 International Preliminary Report on Patentability issued in International Patent Application No. PCT/JP2018/000314.

* cited by examiner

Fig.3
(A)
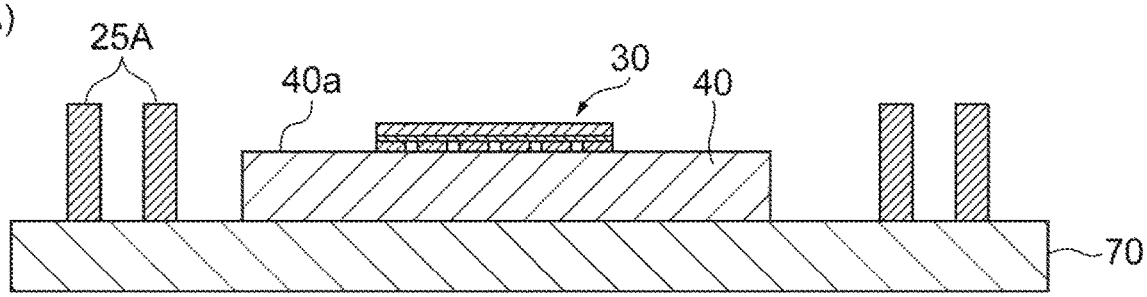
(B)
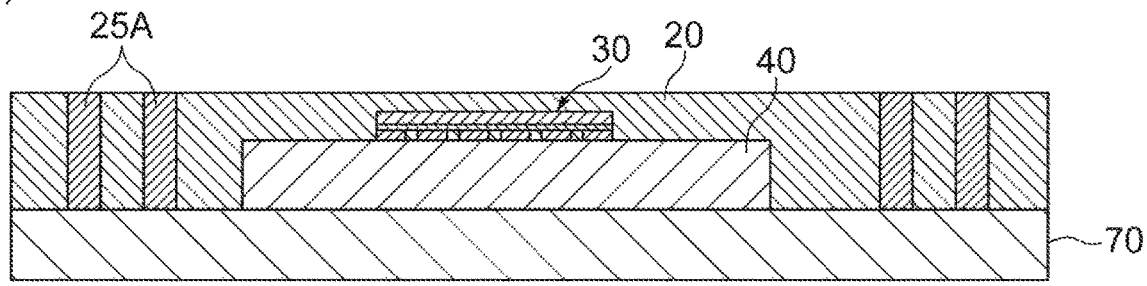

Fig.4
(A)
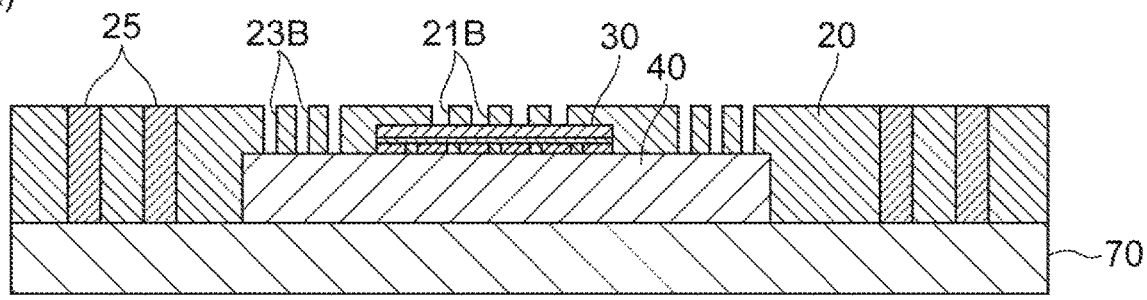
(B)
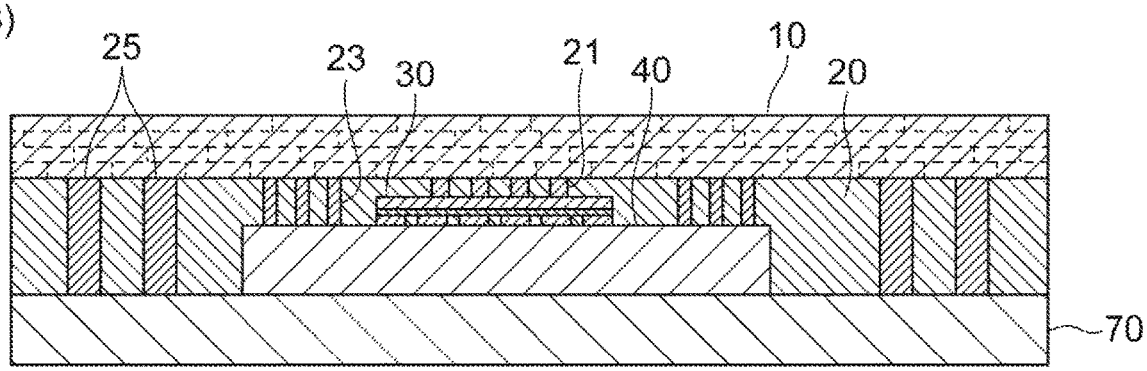

Fig.5
(A)
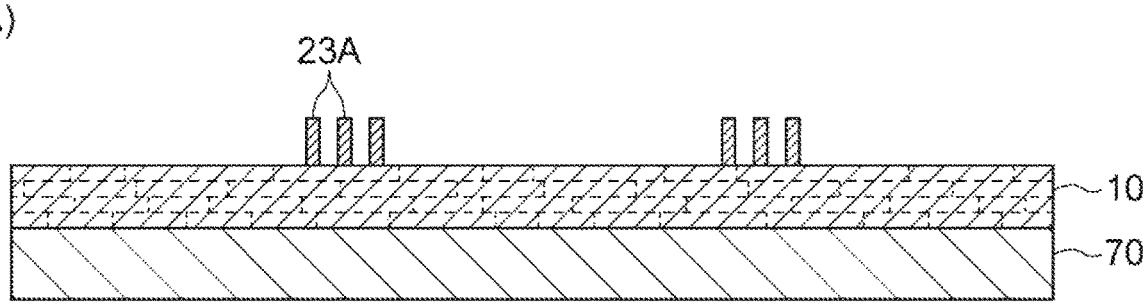
(B)
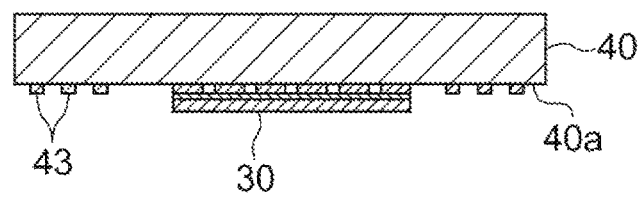

Fig.6
(A)
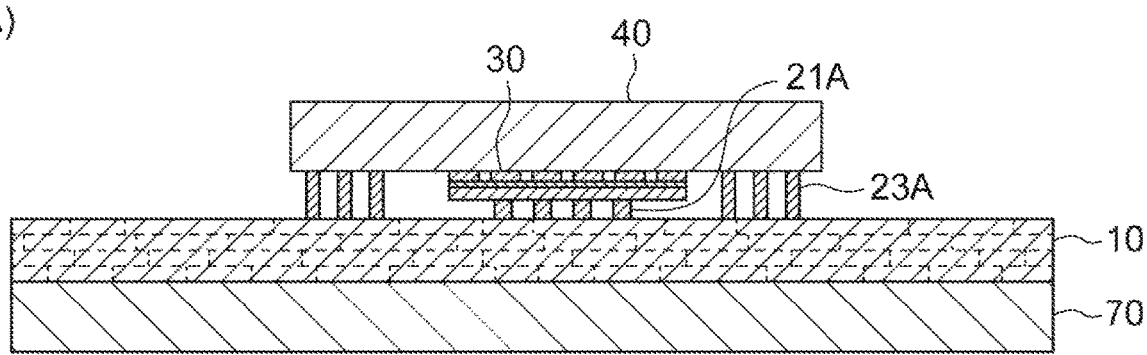
(B)
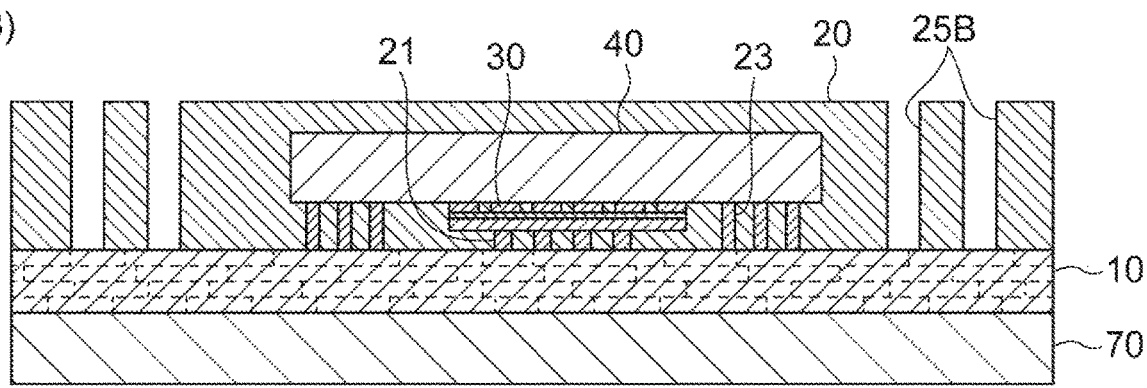

ELECTRONIC COMPONENT MOUNTING PACKAGE

TECHNICAL FIELD

The present invention relates to an electronic component mounting package.

BACKGROUND ART

For packages in which a semiconductor element is mounted, for the purpose of stabilization and the like of supplying of a power supply voltage, a configuration, in which a passive element such as a thin-film capacitor is disposed in the vicinity of the semiconductor element, has been examined. For example, Patent Literature 1 discloses a configuration in which a passive element is disposed inside a substrate in which a semiconductor element is mounted. In addition, Patent Literature 2 discloses a configuration in which an interposer of a thin-film capacitor is disposed between a substrate and a semiconductor element.

CITATION LIST

Patent Literature

Patent Literature 1: Japanese Unexamined Patent Publication No. 2013-30528
Patent Literature 2: Japanese Unexamined Patent Publication No. 2012-138595

SUMMARY OF INVENTION

Technical Problem

However, in configurations disclosed in Patent Literature 1 and Patent Literature 2, there is a possibility that a passive element disposed in the vicinity of a semiconductor element will not be able to sufficiently exhibit characteristics due to noise or the like from outside, such as from other electronic components or wiring.

The present invention has been made in consideration of the foregoing circumstances, and an object thereof is to provide an electronic component mounting package which can appropriately operate a semiconductor element while minimizing deterioration in performance of a passive element caused by noise from outside.

Solution to Problem

In order to achieve the foregoing object, according to an aspect of the present invention, there is provided an electronic component mounting package including a wiring portion; a semiconductor element which is disposed such that an active surface faces a main surface of the wiring portion, and which is electrically connected to the wiring portion via a first terminal; and a thin film passive element which is disposed between the active surface of the semiconductor element and the main surface of the wiring portion when seen in a lamination direction, and which is electrically connected to the semiconductor element. A part of the first terminal is disposed on an outer side with respect to the thin film passive element in a plan view. A length of the first terminal in the lamination direction disposed on the outer side with respect to the thin film passive element is larger than a thickness of the thin film passive element in the lamination direction.

Since the first terminal larger than the thickness of the thin film passive element is disposed on the outer side with respect to the thin film passive element in a plan view, noise generated outside reaches the thin film passive element in a state of being alleviated by the first terminal provided on the outer side of the thin film passive element. Therefore, the semiconductor element can be appropriately operated while minimizing deterioration in performance of the thin film passive element caused by noise from outside.

Here, it is possible to constitute an aspect further including a second terminal located on the main surface of the wiring portion on the outer side of the first terminal with respect to the thin film passive element in a plan view and which is longer than the first terminal in the lamination direction.

When the second terminal having a longer length in the lamination direction than the first terminal is provided on the outer side of the first terminal, the influence of noise from outside can be further reduced in the thin film passive element. Therefore, the semiconductor element can be appropriately operated while minimizing deterioration in performance of the thin film passive element caused by noise from outside.

In addition, it is possible to constitute an aspect in which a whole circumference around the thin film passive element is surrounded by the first terminal and the second terminal in a plan view.

When either of the first terminal or the second terminal is disposed to surround the whole circumference around the thin film passive element, the influence of noise from outside can be reduced in the thin film passive element, regardless of the disposition of a noise source provided outside.

It is possible to constitute an aspect in which a plurality of first terminals and a plurality of second terminals are disposed in order outward from the thin film passive element in a plan view, and a gap between the first terminals adjacent to each other is smaller than a gap between the second terminals adjacent to each other.

As described above, the first terminals and the second terminals are disposed in order outward from the thin film passive element, and the gap between the first terminals is caused to be smaller than the gap between the second terminals. Therefore, the effect of the first terminals and the second terminals minimizing noise from outside can be further enhanced.

It is possible to constitute an aspect further including a via conductor which electrically connects the thin film passive element and the wiring portion to each other.

According to the foregoing configuration, a short current-flowing path can be ensured between the thin film passive element and the wiring portion. Therefore, generation of parasitic capacitance in a current path can be minimized, and the function as a semiconductor element can be improved.

It is possible to constitute an aspect in which the length of the first terminal is half or less of a wavelength of noise received by the thin film passive element from a noise source.

The wavelength of noise received by the thin film passive element varies in accordance with the noise source. However, since the length of the first terminal is caused to be half or less of the wavelength of noise, the effect of minimizing noise can be enhanced.

Advantageous Effects of Invention

According to the present invention, there is provided an electronic component mounting package which can appropriately operate a semiconductor element while minimizing deterioration in performance of a passive element caused by noise from outside.

BRIEF DESCRIPTION OF DRAWINGS

FIG. 3 is a view describing a first manufacturing method for the electronic component mounting package.

FIG. 4 is another view describing the first manufacturing method for the electronic component mounting package.

FIG. 5 is a view describing a second manufacturing method for the electronic component mounting package.

FIG. 6 is a view describing the second manufacturing method for the electronic component mounting package.

DESCRIPTION OF EMBODIMENT

Hereinafter, with reference to the drawings, an embodiment of the present invention will be described in detail. The same reference signs are applied to the same elements in description of the drawings, and duplicated description is omitted.

Figure 1:
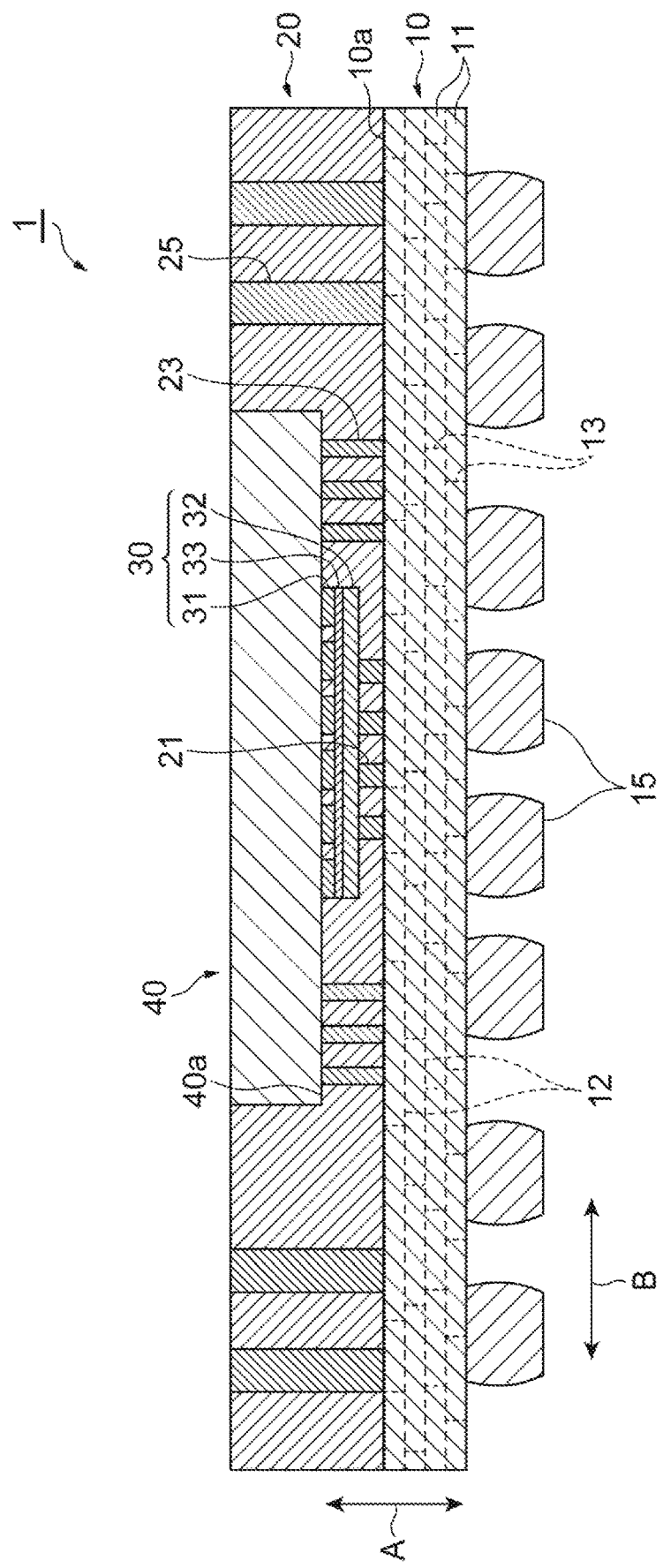
FIG. 1 is a schematic diagram of a configuration of an electronic component mounting package according to an embodiment of the present invention.

FIG. 1 is a schematic diagram of a configuration describing an electronic component mounting package according to the embodiment of the present invention. For example, the electronic component mounting package illustrated in FIG. 1 is used in electronic instruments such as communication terminals.

As illustrated in FIG. 1, an electronic component mounting package 1 has a wiring portion 10, an insulating portion 20 provided on the wiring portion 10, a thin film passive element 30 provided inside the insulating portion 20 on the wiring portion 10, and a semiconductor element 40 provided inside the insulating portion 20 on the wiring portion 10, that is, on the thin film passive element 30.

The wiring portion 10 is constituted of a so-called multilayer wiring substrate, in which a plurality of insulating layers 11 formed of an insulative material and a plurality of conducting layers 12 formed of a conductive material are alternately laminated in a lamination direction (vertical direction in FIG. 1: in FIG. 1, the lamination direction is indicated with an arrow A), and a plurality of via conductors 13 constituted of a conductive material for electrically connecting the plurality of conducting layers to each other are formed. In FIG. 1 and the like, the wiring portion 10 is schematically illustrated. Each of the insulating layers 11 and the conducting layers 12 in the wiring portion 10 may be a single layer. For example, a resin (a polyimide resin, an epoxy resin, an acrylic resin, a phenol resin, or the like) can be used as a main composition of the insulating layer 11. In addition, a material having a main composition of tantalum (Ta), nickel (Ni), copper (Cu), tungsten (W), platinum (Pt), palladium (Pd), iridium (Ir), ruthenium (Ru), rhodium (Rh), an alloy containing these metals, and intermetallic compounds is suitably used for the conducting layer 12. However, the material is not limited thereto. The term "main composition" indicates that the proportion of the corresponding composition is 50 mass % or more.

The insulating portion 20 is provided on the wiring portion 10. The material of the insulating portion 20 need only be an insulating material and is not particularly limited. For example, a resin (a polyimide resin, an epoxy resin, an acrylic resin, a phenol resin, or the like) can be used as the main composition. A filler having insulating properties or high electrical resistance may be incorporated inside the insulating portion 20. Accordingly, mechanical strength of the insulating portion 20 can be enhanced. The insulating portion 20 is also provided between the wiring portion 10 and the thin film passive element 30, between the wiring portion 10 and the semiconductor element 40, and the like. That is, the insulating portion 20 functions as a sealing material for sealing the thin film passive element 30 and the semiconductor element 40.

The thin film passive element 30 is provided on the wiring portion 10 with the insulating portion 20 therebetween. The thin film passive element 30 is a passive element (passive component) connected to conducting wiring of the wiring portion 10 and the semiconductor element 40. In FIG. 1, a case in which the thin film passive element 30 is a thin-film capacitor having an upper electrode 31, a dielectric layer 33, and a lower electrode 32 laminated in this order from above in the lamination direction will be described. That is, the upper electrode 31 is provided on the semiconductor element 40 side, and the lower electrode 32 is provided on the wiring portion 10 side. FIG. 1 illustrates an example in which the upper electrode 31 is divided into a plurality of electrodes. However, in addition to the upper electrode 31, the lower electrode 32 may also be divided. In addition, both the upper electrode 31 and the lower electrode 32 do not have to be divided. In addition, the structure of the thin film passive element 30 may be suitably changed. In accordance with the structure of the thin film passive element 30, the shape and the like of wiring for connecting the wiring portion 10 and the semiconductor element 40 to each other are also suitably changed.

As a material for the upper electrode 31 and the lower electrode 32, a material having a main composition of tantalum (Ta), nickel (Ni), copper (Cu), tungsten (W), platinum (Pt), palladium (Pd), iridium (Ir), ruthenium (Ru), rhodium (Rh), an alloy containing these metals, and intermetallic compounds is suitably used for the electrodes. However, the material is not limited thereto. Each of the electrodes may include a slight amount of impurities or the like, in addition to a material which becomes the main composition. A combination of materials for the upper electrode 31 and the lower electrode 32 is not particularly limited. For example, Cu can be the main composition of the upper electrode 31, and Ni can be the main composition of the lower electrode 32. The term "main composition" indicates that the proportion of the corresponding composition is 50 mass % or more.

The dielectric layer 33 is constituted of a Perovskite-based dielectric material. Here, the Perovskite-based dielectric material in the present embodiment includes a dielectric (ferroelectric) material having a Perovskite structure such as barium titanate ($BaTiO_3$), barium strontium titanate (($Ba_{1-x}Sr_x$)$TiO_3$), ($Ba_{1-x}Ca_x$)$TiO_3$, $PbTiO_3$, or $Pb(Zr_xTi_{1-x})O_3$, and a composite Perovskite relaXer-type ferroelectric material represented by $Pb(Mg_{1/3}Nb_{2/3})O_3$ and the like. Here, in the Perovskite structure and the Perovskite relaxer-type ferroelectric material described above, generally, the ratio of a B site to an A site is an integer ratio. However, for the sake of improvement of characteristics, the ratio may be intentionally deviated from the integer ratio. The dielectric layer 33 may suitably contain additives as accessory compositions to control characteristics of the dielectric layer 33.

The insulating portion 20 is provided between the lower electrode 32 of the thin film passive element 30 and a main surface 10a which is an upper surface of the wiring portion 10. Inside this insulating portion 20, a plurality of via conductors 21, in which a penetration hole extending in the lamination direction is formed and a conductor is introduced into the hole, are provided. The disposition, the number, the size, and the like of the via conductors 21 are suitably changed based on the shape of the lower electrode 32, and wiring and the like in the wiring portion 10.

The semiconductor element 40 is provided above the thin film passive element 30. The semiconductor element 40 used in the electronic component mounting package 1 is not particularly limited. For example, a large scale integrated circuit (LSI), an application specific integrated circuit (ASIC), and a central processing unit (CPU) can be used. The semiconductor element 40 is attached such that an active surface 40a becomes a lower side and faces the thin film passive element 30. The semiconductor element 40 has a larger main surface than the thin film passive element 30. Then, as illustrated in FIG. 1, these are disposed such that the semiconductor element 40 overlaps the thin film passive element 30 from above when seen in the lamination direction. In other words, in a plan view, an end portion of the semiconductor element 40 is in a state of being disposed around the thin film passive element 30. In the present embodiment, a plan view indicates a state in which a surface (a surface including an arrow B direction in FIG. 1) orthogonal to the lamination direction is seen in the lamination direction (an arrow A direction).

In the example illustrated in FIG. 1, an example in which the thin film passive element 30 and the semiconductor element 40 are directly connected to each other is illustrated. However, the insulating portion 20 may be interposed between the thin film passive element 30 and the semiconductor element 40, and the thin film passive element 30 and the semiconductor element 40 may be electrically connected to each other by a conducting material (for example, solder, an Au bump, or a Cu core ball) which is provided in the insulating portion 20 and extends in the lamination direction. In addition, FIG. 1 illustrates a so-called double-sided electrode structure in which the lower electrode 32 of the thin film passive element 30 is electrically connected to the wiring portion 10 via the via conductors 21 below thereof, and the upper electrode 31 of the thin film passive element 30 and the semiconductor element 40 are electrically connected to each other. However, the thin film passive element 30 may have a so-called one-sided electrode structure. In such a case, no via conductor 21 (conductor) is provided between the thin film passive element 30 and the wiring portion 10. In this manner, the electrode structure of the thin film passive element 30, the disposition of wiring for connecting the thin film passive element 30 and another component to each other, and the like can be suitably changed.

As illustrated in FIG. 1, a plurality of first terminals 23 for directly connecting the semiconductor element 40 and the wiring portion 10 to each other are provided in the insulating portion 20 around the thin film passive element 30. The first terminal 23 is a terminal in which a conductor is introduced into the penetration hole penetrating the insulating portion 20 between the semiconductor element 40 and the wiring portion 10 in the lamination direction, and which is used as the signal transmitting conducting wiring connecting the semiconductor element 40 and the wiring portion 10 to each other. The first terminal 23 is provided inside the insulating portion 20 at a position not overlapping the thin film passive element 30 in a plan view, for example, at a position on an outer side with respect to the thin film passive element 30 in a plan view. Therefore, no thin film passive element 30 is disposed at a position where the first terminal 23 extending in the lamination direction is provided, and the insulating portion 20 is provided between the wiring portion 10 and the semiconductor element 40. In the insulating portion 20 between the semiconductor element 40 and the wiring portion 10 where the first terminal 23 is provided, the thickness thereof (length in the lamination direction) is thicker than the thickness of the thin film passive element 30. Therefore, the length of the first terminal 23 seen in the lamination direction becomes larger than the thickness of the thin film passive element 30. The disposition, the number, the size, and the like of the first terminal 23 are suitably changed based on the shape of the semiconductor element 40, and wiring and the like in the wiring portion 10.

If the first terminal 23 is provided at a position on the outer side with respect to the thin film passive element 30 in a plan view, noise from outside is alleviated by the first terminal 23. Accordingly, it is possible to minimize the influence to the thin film passive element 30 caused by noise. Therefore, deterioration in performance of the thin film passive element 30 can be minimized, and the performance of the semiconductor element 40 which operates together with the thin film passive element 30 can also be appropriately maintained.

The expression "an outer side with respect to the thin film passive element 30 in a plan view" indicates an outer side of the thin film passive element 30 in a plan view when the thin film passive element 30 is disposed at the center. That is, the expression "the first terminal 23 is disposed on an outer side with respect to the thin film passive element 30 in a plan view" indicates that at least a part of the first terminal 23 is present on an outer side of an outer circumference of the thin film passive element 30. When there are a plurality of first terminals 23, all of the first terminals 23 do not have to be provided on the outer side with respect to the thin film passive element 30. However, if a number of first terminals 23 are provided on the outer side and are disposed while having predetermined gaps such that the outer circumference of the thin film passive element 30 is entirely surrounded, the influence to the thin film passive element 30 caused by noise from outside can be reduced. That is, if the proportion of the section of the outer circumference of the thin film passive element 30 surrounded by the first terminals 23 increases, the influence to the thin film passive element 30 caused by noise from outside can be further reduced.

Figure 2:
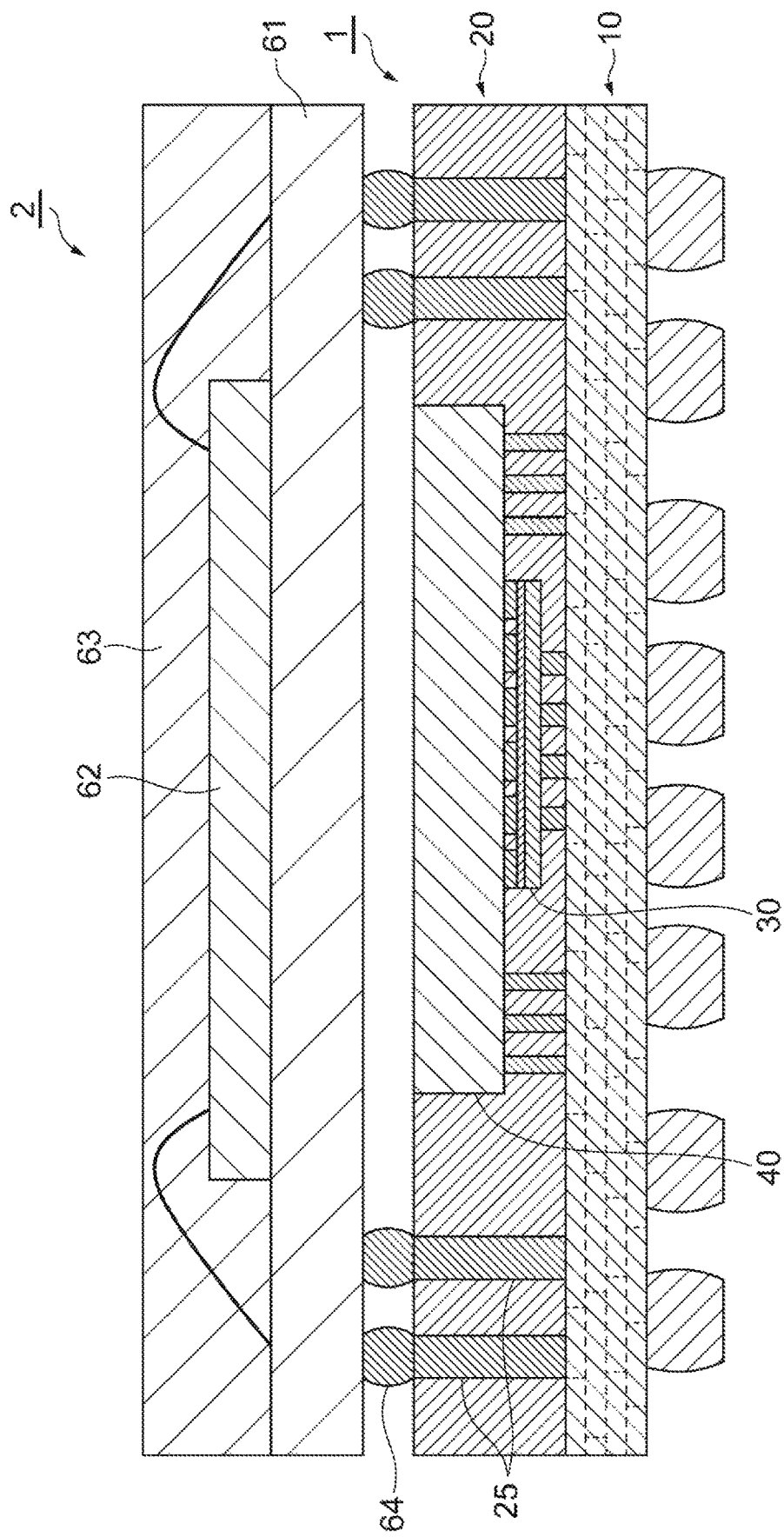
FIG. 2 is a view describing a mounting structure including the electronic component mounting package.

In addition, a plurality of second terminals 25 directly connecting the upper surface of the insulating portion 20 and the wiring portion 10 to each other are provided in the insulating portion 20 around the semiconductor element 40. The second terminal 25 is a terminal in which a conductor is introduced into the penetration hole penetrating the insulating portion 20 provided on the outer side of the semiconductor element 40, in the lamination direction. FIG. 2 illustrates a substrate mounting structure in which an external electronic component or the like is connected to the electronic component mounting package 1 according to the present embodiment. As illustrated in FIG. 2, in a substrate mounting structure 2, an electronic component 60 is provided in an upper portion of the electronic component mounting package 1. FIG. 2 illustrates a configuration in which the electronic component 60 includes a substrate 61, an element portion 62 on the substrate 61, and an insulating portion 63 covering the element portion 62. However, the configuration of the electronic component 60 is not particularly limited. The electronic component 60 is electrically connected to the wiring portion 10 of the electronic component mounting package 1 via the second terminal 25 and an external terminal 64 electrically connected to the second terminal 25. In this manner, the second terminal 25 is a terminal for electrically connecting an external electronic component which is not included in the electronic component mounting package 1, and the conductor of the wiring portion 10.

Similar to the first terminal 23, if the second terminal 25 is provided at a position on the outer side with respect to the thin film passive element 30 in a plan view, noise from outside is also alleviated by the second terminal 25. Accordingly, it is possible to minimize the influence to the thin film passive element 30 caused by noise. Therefore, deterioration in performance of the thin film passive element 30 can be minimized, and the performance of the semiconductor element 40 which operates together with the thin film passive element 30 can also be appropriately maintained.

The expression "the second terminal 25 is disposed on an outer side with respect to the thin film passive element 30 in a plan view" indicates that at least a part of the second terminal 25 is present on an outer side of the outer circumference of the thin film passive element 30. When there are a plurality of second terminals 25, all of the second terminals 25 do not have to be provided on the outer side with respect to the thin film passive element 30. However, if a number of second terminals 25 are provided on the outer side and are disposed while having predetermined gaps such that the outer circumference of the thin film passive element 30 is entirely surrounded, the influence to the thin film passive element 30 caused by noise from outside can be reduced. That is, if the proportion of the section of the outer circumference of the thin film passive element 30 surrounded by the first terminals 23 increases, the influence to the thin film passive element 30 caused by noise from outside can be further reduced. Moreover, as illustrated in FIG. 1 and the like, it is possible to constitute an aspect in which the second terminal 25 is provided on the outer side of the first terminal 23. In this configuration, the influence to the thin film passive element 30 caused by noise from outside can be further reduced.

Returning to FIG. 1, the second terminal 25 is provided inside the insulating portion 20 at a position not overlapping the semiconductor element 40 in a plan view. Therefore, in the insulating portion 20 at a position where the second terminal 25 extending in the lamination direction is provided, the thickness thereof (length in the lamination direction) is thicker than the thickness of the insulating portion 20 in a region in which the first terminal 23 is provided. Therefore, the length of the second terminal 25 seen in the lamination direction becomes longer than the length of the first terminal 23. Therefore, the length (thickness) seen in the lamination direction satisfies the relationship of "second terminal 25>first terminal 23>thin film passive element 30". The disposition, the number, the size, and the like of the second terminal 25 are suitably changed based on the shape of an external component which becomes a target to be connected through the second terminal 25, and wiring and the like in the wiring portion 10. The shape of the second terminal 25 does not have to be the shape of a conductor post as illustrated in FIG. 1 and the like. For example, the second terminal 25 may be formed of a solder ball, a Cu (copper) core ball, or the like.

The gap (pitch) between adjacent first terminals 23 of the plurality of first terminals 23, and the gap (pitch) between adjacent second terminals 25 of the plurality of second terminals 25 may be suitably set in accordance with wiring design or the like of the wiring portion 10. However, when the gap (pitch) between adjacent first terminals 23 is smaller than the gap (pitch) between adjacent second terminals 25, characteristics as the electronic component mounting package 1 are improved.

A bump 15 functioning as an external terminal in accordance with the conducting wiring inside the wiring portion 10 is provided on the main surface on a side opposite to the main surface 10a on a side where the thin film passive element 30 of the wiring portion 10 is provided. The disposition, the number, and the like of the bump 15 can be suitably changed.

The dimensions of each portion of the electronic component mounting package 1 are not particularly limited. For example, the thickness of the electronic component mounting package 1 can be within a range of approximately 100 µm to several millimeters, for example. In addition, the thickness of the wiring portion 10 can be within a range of approximately 50 µm to 1 mm. In addition, the thickness of the thin film passive element 30 can be within a range of approximately 5 µm to 50 µm, and the thickness of the semiconductor element 40 can be within a range of approximately several tens of µm to several hundreds of µm.

Next, a manufacturing method for the electronic component mounting package 1 will be described. In the present embodiment, as the manufacturing method for the electronic component mounting package 1, two methods will be described. First, with reference to FIGS. 3 and 4, a first method will be described. Next, with reference to FIGS. 5 and 6, a second method will be described.

The first method is a method in which each portion included in the electronic component mounting package 1 is formed from an upper side (semiconductor element 40 side) when seen in the lamination direction. First, as illustrated in FIG. 3(A), the semiconductor element 40 is placed on a support plate 70 such as a wafer or a glass, and the thin film passive element 30 is mounted on the active surface 40a of the semiconductor element 40. In FIG. 3(A) and the diagrams thereafter, a state in which one semiconductor element 40 is placed on one support plate 70 is illustrated. However, actually, a plurality of electronic component mounting packages are manufactured on one support plate 70 at the same time. Therefore, a plurality of semiconductor elements 40 are disposed on the support plate 70 with predetermined gaps. In addition, a conductor post 25A serving as the second terminal 25 is disposed at a predetermined position between adjacent semiconductor elements 40 on the support plate 70. When the conductor post 25A serving as the second terminal 25 has a material and a shape which are self-standing, the conductor post 25A can be disposed on the support plate 70 in this manner.

Next, as illustrated in FIG. 3(B), the insulating portion 20 is formed by introducing a mold resin around the semiconductor element 40, the thin film passive element 30, and the conductor post 25A. Accordingly, the semiconductor element 40 and the thin film passive element 30 are in a state of being embedded inside the insulating portion 20. In addition, the second terminal 25 inside the insulating portion 20 is formed when the region around the conductor post 25A is also covered with the insulating portion 20. As necessary, the surface may be polished for the purpose of exposing the upper end of the conductor post 25A.

Next, as illustrated in FIG. 4(A), in the insulating portion 20, penetration holes 21B and 23B penetrating the insulating portion 20 are formed at positions where the via conductors 21 and the first terminals 23 are provided. For example, the penetration holes 21B and 23B can be manufactured through machining or the like utilizing a laser, a blasting method, a jig, or the like. The shape of the penetration holes 21B and 23B corresponds to the shapes of the via conductors 21 and the first terminals 23. However, when the penetration holes 21B and 23B are formed through laser processing, so-called tapered penetration holes 21B and 23B of which a bottom portion (the semiconductor element 40 side or the thin film passive element 30 side) is narrowed in diameter are formed. Thereafter, as illustrated in FIG. 4(B), the via conductors 21 and the first terminals 23 are formed by introducing a conductor into the penetration holes 21B and 23B. Next, as necessary, after the upper surface of the insulating portion 20 is polished, the wiring portion 10 is formed. The wiring portion 10 is manufactured by a known method. The wiring portion 10 may be manufactured while the insulating layers 11 and the conducting layers 12 are alternately laminated on the insulating portion 20. However, a wiring portion 10 manufactured in a different step may be configured to be attached to the upper portion of the insulating portion 20. As a result, as illustrated in FIG. 4(B), a configuration in which the wiring portion 10 is attached to the upper portion of the insulating portion 20 can be obtained. Thereafter, the bump 15 is attached to the upper portion of the wiring portion 10, and the support plate 70 is removed. Then, the electronic component mounting package 1 illustrated in FIG. 1 can be obtained.

Next, the second method will be described. The second method is a method in which each portion included in the electronic component mounting package 1 is formed from a lower side (wiring portion 10 side) when seen in the lamination direction. First, as illustrated in FIG. 5(A), the wiring portion 10 is placed on the support plate 70 such as a wafer or a glass, and a conductor post 23A corresponding to the first terminal 23 is formed on the wiring portion 10. The wiring portion 10 is manufactured by a known method. The wiring portion 10 may be manufactured while the insulating layers 11 and the conducting layers 12 are alternately laminated on the support plate 70. However, a wiring portion 10 manufactured in a different step may be configured to be attached to the upper portion of the support plate 70. In addition, when the conductor post 23A serving as the first terminal 23 has a material and a shape which are self-standing, the conductor post 23A can be disposed on the wiring portion 10 in this manner.

Next, the semiconductor element 40 and the thin film passive element 30 for combining the wiring portion 10 and the conductor post 23A on the support plate 70 are separately prepared. As illustrated in FIG. 5(B), after the semiconductor element 40 and the thin film passive element 30 are combined, a conductor pad 43 is proved at a position where the first terminal 23 is attached on the active surface 40a of the semiconductor element 40. In place of the conductor pad 43, a conductor may be adhered by soldering or the like. The conductor pad 43 is also used for positioning when the conductor post 23A and the semiconductor element 40 are connected to each other.

Next, as illustrated in FIG. 6(A), the wiring portion 10 and the semiconductor element 40 are combined such that the conductor post 23A on the wiring portion 10 and the conductor pad 43 on the semiconductor element 40 are electrically connected to each other. In this case, a conductor post 21A corresponding to the via conductors 21 electrically connecting the thin film passive element 30 and the wiring portion 10 to each other is also separately provided. Accordingly, the wiring portion 10 and the semiconductor element 40, and the wiring portion 10 and the thin film passive element 30 are electrically connected to each other by a conductor.

Next, as illustrated in FIG. 6(B), the insulating portion 20 is formed by introducing a mold resin around the semiconductor element 40, the thin film passive element 30, and the conductor posts 21A and 23A on the wiring portion 10. Accordingly, the semiconductor element 40 and the thin film passive element 30 are in a state of being embedded inside the insulating portion 20. In addition, the via conductors 21 and the first terminals 23 inside the insulating portion 20 are formed when the region around the conductor posts 21A and 23A is also covered with the insulating portion 20. Thereafter, a penetration hole 25B penetrating the insulating portion 20 is formed at a position where the second terminal 25 is provided. For example, the penetration hole 25B can be manufactured through machining or the like utilizing a laser, a blasting method, a jig, or the like. The shape of the penetration hole 25B corresponds to the shapes of the second terminal 25. However, when the penetration hole 25B is formed through laser processing, a so-called tapered penetration hole 25B of which a bottom portion (the wiring portion 10 side) is narrowed in diameter is formed. Thereafter, as illustrated in FIG. 6(B), the second terminal 25 is formed by introducing a conductor into the penetration hole 25B. As necessary, the upper surface of the insulating portion 20 is polished, the support plate 70 is removed, and the bump 15 is attached. Then, the electronic component mounting package 1 illustrated in FIG. 1 can be obtained.

As described above, in the electronic component mounting package 1 according to the present embodiment, the first terminal 23 having a length in the lamination direction larger than the thickness of the thin film passive element 30 is disposed on the outer side with respect to the thin film passive element 30 in a plan view. In this case, the influence of noise generated outside is minimized by the first terminal 23 provided on the outer side of the thin film passive element 30. Therefore, the thin film passive element 30 receives small noise. Electronic component mounting packages in the related art have a problem that performance of the thin film passive element 30 is deteriorated when a connection part between the thin film passive element 30 and the semiconductor element 40 receives the influence of noise from outside. However, when a shielding structure or the like for avoiding the influence of noise from outside is employed, there is a problem that the substrate is increased in size, leading to a problem that the configuration cannot follow the demand for miniaturization in recent years. In contrast, in the electronic component mounting package 1 according to the present embodiment, in addition to the disposition of the thin film passive element 30 and the semiconductor element 40, the first terminal 23 connecting the semiconductor element 40 and the wiring portion 10 to each other is disposed in the foregoing relationship, so that the semiconductor element 40 can be appropriately operated while minimizing deterioration in performance of the thin film passive element 30 caused by noise from outside.

In addition, as in the electronic component mounting package 1 according to the present embodiment, in the case of a configuration in which the influence of noise from outside to the thin film passive element 30 is minimized by the first terminal 23 while the thin film passive element 30 is disposed on the wiring portion 10 and the semiconductor element 40 is disposed thereon, limitation related to the design of wiring around the thin film passive element 30 can be reduced.

If the distance between the semiconductor element 40 and the main surface of the wiring portion 10 in the lamination direction, that is, the length of the first terminal 23 is half or less of the wavelength of noise from a noise source received by the thin film passive element 30, the effect of reducing noise can be further enhanced. The wavelength of noise varies depending on the noise source. In the electronic component mounting package 1 according to the present embodiment, it is postulated that the wavelength of noise received by the thin film passive element 30 is within a range of approximately 1 mm to several millimeters. Therefore, when the length of the first terminal 23 is half or less of the foregoing wavelength, the effect of reducing noise is further enhanced, and the function as the semiconductor element 40 is also improved.

In addition, from the viewpoint of minimizing noise, if at least the first terminal 23 is provided, the influence of noise received by the thin film passive element 30 can be reduced. However, as described above in the embodiment, if the second terminal 25 having a longer length in the lamination direction than the first terminal 23 is provided on the outer side of the first terminal 23 with respect to the thin film passive element 30 in a plan view, the second terminal 25 can further reduce the influence of noise received by the thin film passive element 30 from outside. Therefore, the semiconductor element 40 can be appropriately operated while minimizing deterioration in performance of the thin film passive element 30 caused by noise from outside.

If at least one first terminals 23 and one second terminals 25 are provided on the outer side of the thin film passive element 30, minimizing noise from outside is realized. However, when the section of the outer circumference of the thin film passive element 30 surrounded by the first terminals 23 and the second terminals 25 as described above increases, the effect of minimizing noise from outside can be enhanced. Therefore, when the number of the first terminals 23 and the second terminals 25 provided on the outer side of the thin film passive element 30 increases, noise can be minimized. Then, when either of the first terminal 23 or the second terminal 25 is disposed to surround the whole circumference around the thin film passive element 30, the influence of noise from outside can be reduced in the thin film passive element 30, regardless of the disposition of a noise source provided outside.

In addition, as described above in the embodiment, in a plan view, when the first terminals 23 and the second terminals 25 are disposed in order outward from the thin film passive element 30, and the gap between the first terminals 23 is caused to be smaller than the gap between the second terminals 25, the effect of the first terminal 23 and the second terminal 25 minimizing noise from outside can be further enhanced. That is, noise from outside is first reduced by the second terminals 25 on the outer side. Thereafter, in a state of being further reduced by the first terminals 23 the noise reaches the thin film passive element 30. Since noise can be appropriately minimized in this manner, the semiconductor element 40 can be appropriately operated while minimizing deterioration in performance of the thin film passive element 30 caused by noise from outside. However, even when the gap between the first terminals 23 is larger than the gap between the second terminals 25, noise from outside is minimized by the first terminals 23 and the second terminals 25.

When the gap between adjacent first terminals 23 (or between adjacent second terminals 25) increases, a synergistic effect of a plurality of adjacent first terminals 23 minimizing noise cannot be enhanced, so that there is a possibility that noise will not be sufficiently minimized. The effect of minimizing noise can be enhanced by sufficiently reducing (specifically, approximately 100 µm or smaller between adjacent first terminals 23, and approximately 300 µm or smaller between adjacent second terminals 25) the gap between adjacent first terminals 23 (or between adjacent second terminals 25). If the gap between adjacent first terminals 23 (or between adjacent second terminals 25) is half or less of the wavelength of noise received by the thin film passive element 30 from the noise source, a synergistic effect of minimizing noise can be achieved.

In addition, when a plurality of thin film passive elements 30 are mounted on the wiring portion 10, if the first terminals 23 (and the second terminals 25) are disposed such that the outer circumference of a plurality of thin film passive elements 30 is surrounded in its entirety, the effect of minimizing noise from outside can be achieved. In order to minimize noise received by the thin film passive element 30 from outside, the first terminals 23 (and the second terminals 25) for reducing noise may be provided between an external component, which becomes a noise source, and the thin film passive element 30. Therefore, even when a plurality of thin film passive elements 30 are mounted, if the first terminals 23 (and the second terminals 25) are provided between each of a plurality of thin film passive elements 30 and an external component which becomes a noise source, noise can be appropriately minimized. If the first terminals 23 (and the second terminals 25) are also provided between adjacent thin film passive elements 30 of the plurality of thin film passive elements 30, the influence of noise in each of the thin film passive elements 30 can be further minimized.

In addition, in the electronic component mounting package 1 of the foregoing embodiment, the via conductors 21 electrically connecting the thin film passive element 30 and the wiring portion 10 to each other are provided. According to such a configuration, a short current-flowing path can be ensured between the thin film passive element 30 and the wiring portion 10. Therefore, generation of parasitic capacitance in a current path can be minimized, and the function as the semiconductor element 40 can be improved. In addition, the degree of freedom in design of wiring is enhanced, so that performance can be improved from the viewpoint of path design. In place of the via conductors 21, another conducting material, for example, solder, an Au bump, or a Cu core ball can be used.

Hereinabove, the embodiment of the present invention has been described. However, the present invention is not necessarily limited to the embodiment described above, and various changes can be made within a range not departing from the gist thereof.

For example, the size, the shape, and the like related to the thin film passive element 30 and the semiconductor element 40 can be suitably changed. In addition, the structure, the disposition, and the like of the wiring portion 10 can also be suitably changed.

In addition, the wiring portion and the semiconductor element in the electronic component mounting package, and the structure around the thin film passive element can also be suitably changed.

Figure 7:
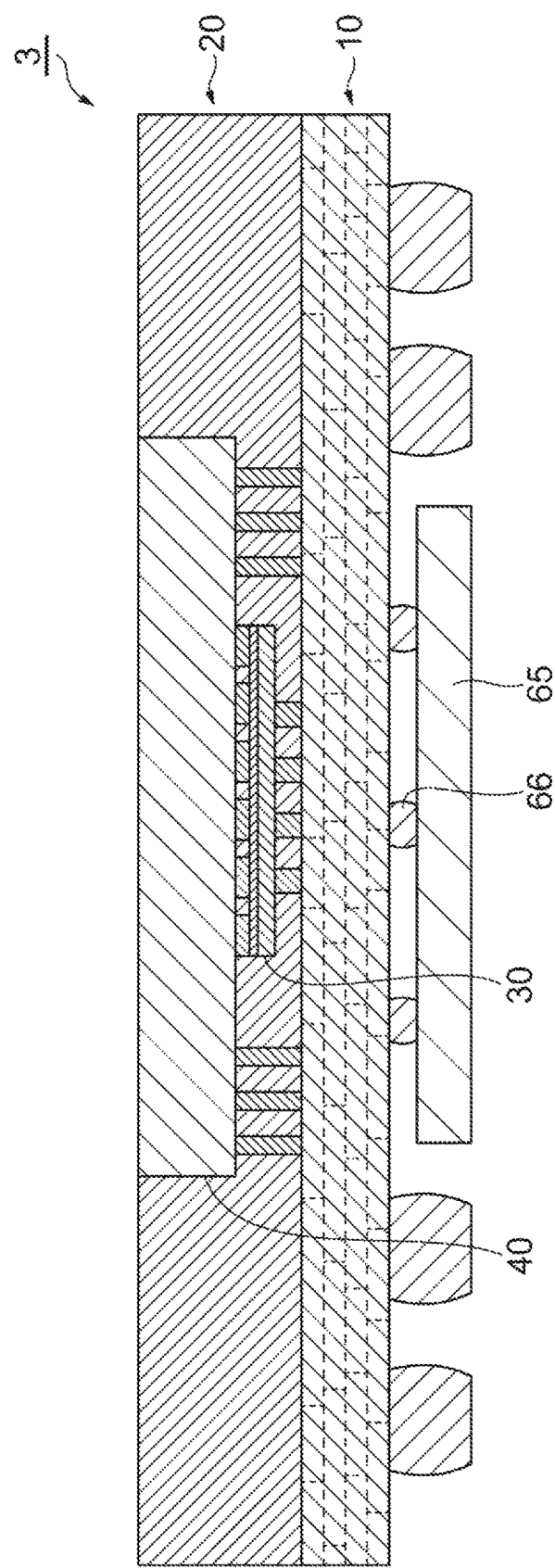
FIG. 7 is a view describing a first modification example of an electronic component mounting package.

FIG. 7 is a view illustrating an electronic component mounting package 3 according to a first modification example. In the electronic component mounting package 3 illustrated in FIG. 7, an element portion (for example, a memory) connected to the wiring portion 10 is provided at a position where the bump 15 is provided in the case of the electronic component mounting package 1 described in the foregoing embodiment. Specifically, in the electronic component mounting package 3, an element portion 65 is provided with respect to the wiring portion 10 on a side opposite to the semiconductor element 40. In addition, the element portion 65 and the wiring portion 10 are connected to each other with a bump 66 therebetween. In this structure, the distance between the semiconductor element 40 and the element portion 65 becomes shorter, so that operational performance of the semiconductor element 40 can be further enhanced.

Figure 8:
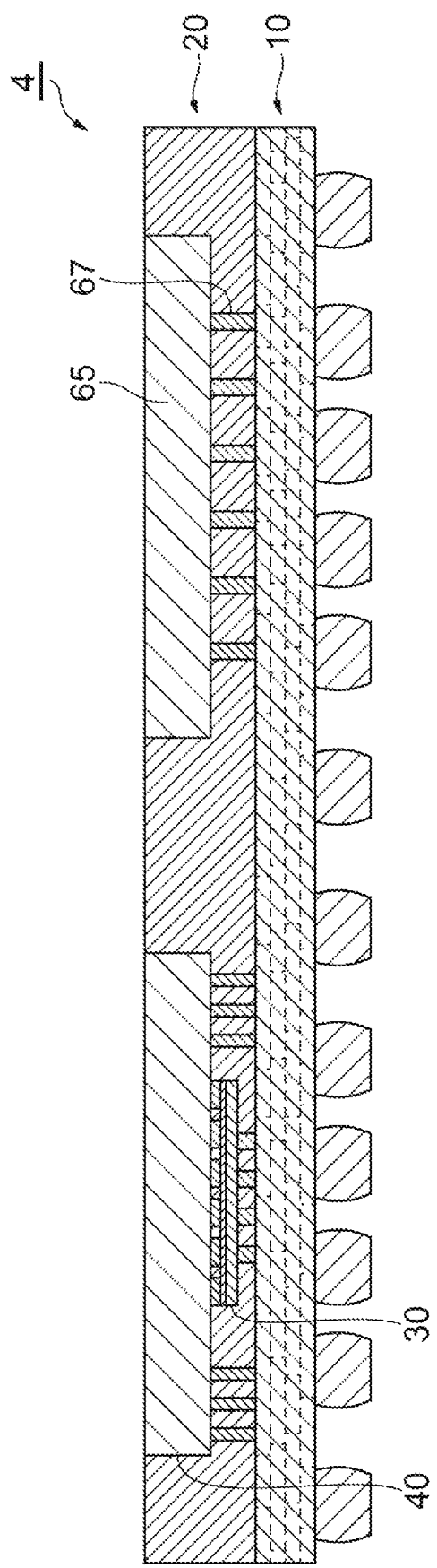
FIG. 8 is a view describing a second modification example of an electronic component mounting package.

FIG. 8 is a view illustrating an electronic component mounting package 4 according to a second modification example. In the electronic component mounting package 4 illustrated in FIG. 8, an element portion (for example, a memory) is provided to be adjacent to the semiconductor element 40 in the electronic component mounting package 1 described in the foregoing embodiment. Specifically, in the electronic component mounting package 4, the element portion 65 is provided next to the semiconductor element 40 inside the insulating portion 20. In addition, the element portion 65 and the wiring portion 10 are connected to each other by a third terminal 67. In this manner, even in the case of a structure in which the element portion 65 is disposed inside the insulating portion 20, the distance between the semiconductor element 40 and the element portion 65 becomes shorter, so that operational performance of the semiconductor element 40 can be further enhanced.

In addition, no second terminal 25 is provided in the electronic component mounting package 3 illustrated in FIG. 7 and the electronic component mounting package 4 illustrated in FIG. 8. In this manner, when the second terminal 25 for electrically connecting an external electronic component, which is not included in the electronic component mounting package 1, and a conductor of the wiring portion 10 to each other is not necessary, it can be omitted.

REFERENCE SIGNS LIST

1 Electronic component mounting package
2 Substrate mounting structure
10 Wiring portion
20 Insulating portion
21 Via conductor
23 First terminal
25 Second terminal
30 Thin film passive element
40 Semiconductor element

The invention claimed is:

1. An electronic component mounting package comprising:
    a wiring portion;
    a semiconductor element which is disposed such that an active surface faces a main surface of the wiring portion, and which is electrically connected to the wiring portion via a first terminal; and
    a thin film passive element which is disposed between the active surface of the semiconductor element and the main surface of the wiring portion when seen in a lamination direction, and which is electrically connected to the semiconductor element,
    wherein a part of the first terminal is disposed on an outer side with respect to the thin film passive element in a plan view,
    a length of the first terminal in the lamination direction disposed on the outer side with respect to the thin film passive element is larger than a thickness of the thin film passive element in the lamination direction, and
    the length of the first terminal is half or less of a wavelength of noise received by the thin film passive element from a noise source.

2. The electronic component mounting package according to claim 1, further comprising:
    a second terminal located on the main surface of the wiring portion on the outer side of the first terminal with respect to the thin film passive element in a plan view and which is longer than the first terminal in the lamination direction.

3. The electronic component mounting package according to claim 2,
    wherein a whole circumference around the thin film passive element is surrounded by the first terminal and the second terminal in a plan view.

4. The electronic component mounting package according to claim 2,
    wherein a plurality of first terminals and a plurality of second terminals are disposed in order outward from the thin film passive element in a plan view, and a gap between the first terminals adjacent to each other is smaller than a gap between the second terminals adjacent to each other.

5. The electronic component mounting package according to claim 1, further comprising:
    a via conductor which electrically connects the thin film passive element and the wiring portion to each other.

* * * * *